(12) United States Patent
Tan et al.

(10) Patent No.: US 9,020,006 B2
(45) Date of Patent: Apr. 28, 2015

(54) HIGH DENSITY LASER OPTICS

(75) Inventors: Michael Renne Ty Tan, Menlo Park, CA (US); David A. Fattal, Mountain View, CA (US); Wayne V. Sorin, Mountain View, CA (US); Sagi Varghese Mathai, Berkeley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/364,746

(22) PCT Filed: Jan. 18, 2012

(86) PCT No.: PCT/US2012/021698
§ 371 (c)(1),
(2), (4) Date: Sep. 10, 2014

(87) PCT Pub. No.: WO2013/109264
PCT Pub. Date: Jul. 25, 2013

(65) Prior Publication Data
US 2014/0376580 A1    Dec. 25, 2014

(51) Int. Cl.
*H01S 5/00* (2006.01)
*H01S 5/10* (2006.01)
*H01S 5/183* (2006.01)
*H01S 5/187* (2006.01)

(52) U.S. Cl.
CPC .............. *H01S 5/1092* (2013.01); *H01S 5/183* (2013.01); *H01S 5/187* (2013.01)

(58) Field of Classification Search
USPC ................ 372/50.124, 50.121, 50.12, 50.11, 372/50.23, 50.1
See application file for complete search history.

(56) References Cited

U.S. PATENT DOCUMENTS

| | | | |
|---|---|---|---|
| 5,394,489 A * | 2/1995 | Koch | ................................ 385/14 |
| 5,784,183 A | 7/1998 | Aoki et al. | |
| 7,050,470 B1 | 5/2006 | Hayden et al. | |
| 7,092,598 B2 | 8/2006 | Evans | |
| 7,535,944 B1 * | 5/2009 | Guilfoyle et al. | .......... 372/50.11 |
| 2007/0223552 A1 | 9/2007 | Muendel et al. | |

(Continued)

FOREIGN PATENT DOCUMENTS

| | | |
|---|---|---|
| EP | 0636908 A1 | 2/1995 |
| WO | WO-2010091688 A1 | 8/2010 |
| WO | WO-2010138524 A2 | 12/2010 |

OTHER PUBLICATIONS

Huang, M.C.Y. et al., Single Mode High-contrast Subwavelength Grating Vertical Cavity Surface Emitting Lasers, (Research Paper), Applied Physics Letters, Apr. 2008, vol. 92, No. 17, pp. 171108-1-171108-3.

(Continued)

*Primary Examiner* — Kinam Park
(74) *Attorney, Agent, or Firm* — Brooks, Cameron & Huebsch, PLLC

(57) ABSTRACT

Apparatuses and methods for high density laser optics are provided. An example, of a laser optics apparatus includes a plurality of vertical cavity surface emitting lasers (VCSELs) in a monolithically integrated array, a high contrast grating (HCG) integrated with an aperture of a vertical cavity of each of the plurality of the VCSELs to enable emission of a single lasing wavelength of a plurality of lasing wavelengths, and a plurality of single mode waveguides, each integrated with a grating coupler, that are connected to each of the plurality of the integrated VCSELs and the HCGs, where each of the grating couplers is aligned to an integrated VCSEL and HCG.

15 Claims, 7 Drawing Sheets

(56) References Cited

U.S. PATENT DOCUMENTS

2011/0158278 A1   6/2011  Koch
2011/0280269 A1*  11/2011 Chang-Hasnain et al. .. 372/50.1
2012/0008658 A1*  1/2012  Chung ........................ 372/45.01
2012/0128019 A1*  5/2012  Chang-Hasnain et al. 372/45.01
2012/0189024 A1*  7/2012  Fattal et al. ..................... 372/12

OTHER PUBLICATIONS

Imamura, A. et al., Multi-wavelength VCSEL Array Based on High Contrast Sub-wavelength Grating, (Research Paper), LEOS Annual Meeting Conference Proceedings, Oct. 4-8, 2009, pp. 811-812.
International Search Report & Written Opinion, Sep. 27, 2012, PCT Patent Application No. PCT/US2012/021698, 10 pages.

* cited by examiner

HIGH DENSITY LASER OPTICS

BACKGROUND

Transmission of light through waveguides has been used for many types of communications applications. Light signals offer potential advantages over electronic signals. Light sources can be created from semiconductor devices, including semiconductor devices such as light emitting diodes and laser diodes.

Optical fiber is used as a transmission medium for light signals. A single fiber is capable of carrying several different modulated signals within it at one time. For instance, wavelength division multiplexing may divide a bandwidth of the fiber into different channels (e.g., each channel containing a small range of wavelengths) and thus may transmit several different wavelengths (e.g., signals) of light at once. Using such a system requires sources for the different wavelengths.

DETAILED DESCRIPTION

High speed optical interconnects operating at bandwidths above 1 terabit per second are an attractive option based, for instance, on their low power consumption and compact size in comparison to electrical interconnects. Wavelength division multiplexing can provide high bandwidth terabit optical fiber (e.g., more than 1 terabit per second). For such applications, monolithically integrated low cost multi-wavelength sources are desirable. VCSELs are an effective option for multi-wavelength sources with benefits that include surface normal emission, low cost manufacturing, and wafer scale testing. Furthermore, multi-wavelength VCSEL sources may provide cost effective solutions for a wide range of applications that, for example, include optical communication systems, such as in a data center.

Examples of the present disclosure include apparatuses, methods, and machine-readable and executable instructions and/or logic for laser optics. Implementation of the examples provided in the present disclosure provides a high density optical engine that uses multiple wavelengths.

An example of a high density laser optics apparatus according to the present disclosure includes a first plurality of VCSELs in a monolithically integrated array, an HCG integrated with an aperture of a vertical cavity of each of the first plurality of VCSELs to enable emission of a single lasing wavelength of a plurality of lasing wavelengths, and a plurality of single mode waveguides, each integrated with a grating coupler, that are connected to each of the first plurality of integrated VCSELs and the HCGs, where each of the grating couplers is aligned to an integrated VCSEL and HCG.

Figure 1:
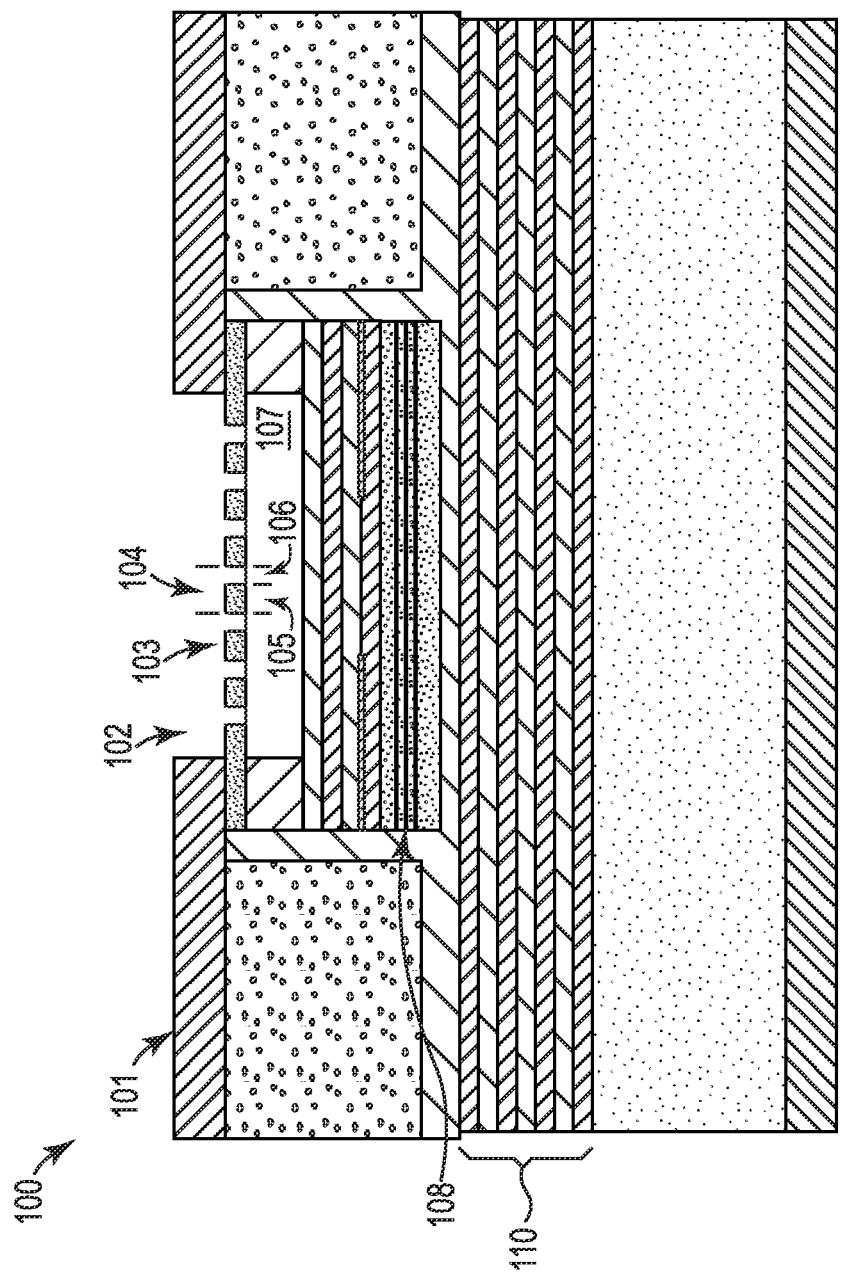
FIG. 1 illustrates an example of a vertical cavity surface emitting laser (VCSEL) integrated with a high contrast grating (HCG) according to the present disclosure.

FIG. 1 illustrates an example of a VCSEL integrated with an HCG according to the present disclosure. VCSELs can be formed in various configurations that may include various constituents such as, for example, p-contacts, n-contacts, sacrificial layers, oxide layers, passivation layers, among others. For purposes of the present disclosure, constituents directly relating to production and/or emission of discrete lasing wavelengths are discussed.

In the detailed description of the present disclosure, reference is made to the accompanying drawings that form a part hereof and in which is shown by way of illustration how examples of the disclosure may be practiced. These examples are described in sufficient detail to enable those of ordinary skill in the art to practice the examples of this disclosure and it is to be understood that other examples may be utilized and that process, electrical, and/or structural changes may be made without departing from the scope of the present disclosure. Further, where appropriate, as used herein, "for example' and "by way of example" should be understood as abbreviations for "by way of example and not by way of limitation".

The figures herein follow a numbering convention in which the first digit or digits correspond to the drawing figure number and the remaining digits identify an element or component in the drawing. Similar elements or components between different figures may be identified by the use of similar digits. For example, 116 may reference element "16" in FIG. 1, and a similar element may be referenced as 216 in FIG. 2. Elements shown in the various figures herein may be added, exchanged, and/or eliminated so as to provide a number of additional examples of the present disclosure. In addition, the proportion and the relative scale of the elements provided in the figures are intended to illustrate the examples of the present disclosure and should not be taken in a limiting sense.

As illustrated in FIG. 1, the example of the VCSEL integrated with an HCG 100 can include an example of a VCSEL 101 with an aperture of a vertical cavity 102 (e.g., associated with a top surface of the VCSEL 101 relative to other components thereof). An HCG 103 can be integrated with the aperture of the vertical cavity 102. In some examples, the HCG 103 also can serve as a top mirror of the VCSEL 101.

The HCG 103 can be formed to include a grating having a particular pitch 104 and a particular duty cycle (e.g., via electron beam lithography, among other suitable etching techniques, of the top mirror). As used in the present disclosure, a grating's pitch 104 means a regularly repeated distance between a beginning of one solid bar of the grating and a beginning of an adjacent solid bar of the grating. As such, the pitch 104 traverses a width of one solid bar 105 and an adjacent empty space 106 between the adjacent solid bars. As used in the present disclosure, a grating's duty cycle means a ratio of the width of the solid bar 105 to the pitch 104. The pitch 104 can be constant (e.g., regularly repeated) across a span of an HCG because the width of the solid bars 105 and empty spaces 106 can be constant, which can also make the duty cycle constant across the span of the HCG.

The example of the VCSEL integrated with an HCG 100 can be formed to include an undercut portion of a vertical cavity 107 below the HCG 103 (e.g., via suitable underetching techniques). The vertical cavity 107 appears to be vacant in FIG. 1 for purposes of illustration. However, in various examples, the vertical cavity 107 can be filled with various gaseous, liquid, and/or solid materials (e.g., as described herein or otherwise). An active region 108 can be formed below the undercut portion of the vertical cavity 107. The active region 108 can be formed from a number of layers of gain medium material that, upon electrical stimulation, can amplify production of photons of a particular number or range of wavelengths.

The example of the VCSEL integrated with an HCG 100 can be formed to include a number of layers below the active region 108 that can be used as a bottom mirror 110. A predetermined structure of a plurality of layers of the bottom mirror 110 can, in some examples, result in the bottom mirror 110 being formed as distributed Bragg reflector (DBR) mirrors.

When an electron and a hole are present in the same region, they may recombine or "annihilate" with the result being spontaneous emission, that is, the electron may re-occupy the energy state of the hole, emitting a photon with energy equal to the difference between the electron and hole states involved. A number of materials presented herein are examples of compound semiconductor materials that can be used to create junction diodes that emit photons. A nearby photon with energy equal to the recombination energy can cause recombination by stimulated emission. This can generate another photon of the same frequency, traveling in the same direction, with the same polarization and phase as the first photon. Stimulated emission causes gain in an optical wave (e.g., of a particular wavelength) in the injection region, and the gain increases as the number of electrons and holes injected across the junction increases.

A gain region can be associated with an optical cavity such that the light is confined to a relatively narrow line. Two ends of the cavity can form smooth, parallel edges, for instance, forming a Fabry-Pérot resonator. Photons can be reflected several times from each end face before they are emitted. As a light wave passes through the cavity, it can be amplified by stimulated emission. If there is more amplification than loss (e.g., due to absorption and/or by incomplete reflection from the end facets), the diode begins to "lase".

Some properties affecting emitted photon wavelengths can be determined by geometry of the optical cavity. In a vertical direction, the light can be contained in a thin layer and the structure may support a single optical mode in a direction perpendicular to the layers. In a transverse direction, if the optical cavity is wide compared to the wavelength of light, then the waveguide can support multiple transverse optical modes, and the laser is known as "multi-mode". In applications where a small focused beam is desired, the optical cavity may be made narrow, on the order of an optical wavelength. As such, a single transverse mode is supported. Such single mode lasers may be used for optical storage, laser pointers, and laser optics, among other applications.

A mode in a laser is a standing lightwave. Some lasers are multi-mode, which may result from various factors such as, for instance, a size and shape of the optical cavity, a particular material and configuration of the active region, and the type of mirrors, among other considerations. Based on such considerations, a multi-mode laser may be reduced toward being a single mode laser via integrating an HCG with an aperture of a vertical cavity. The thickness, pitch, and/or duty cycle of the HCG integrated with an aperture of a vertical cavity of a VCSEL can support a single standing lightwave (e.g., with single longitudinal and vertical parameters) in the cavity and, therefore, a single lasing wavelength can be emitted by the laser. In some examples, a single lasing wavelength can include a number of wavelengths within a range of 1 nanometer (nm). In addition, the thickness, pitch, and/or duty cycle of the HCG can, as described herein, be adjusted to change the single mode of the VCSEL and the single lasing wavelength emitted by the laser.

Such variations in the characteristics that affect the size of the aperture of an HCG also can contribute to affecting reflectivity of the HCG. As such, changes to the size of the aperture and/or the reflectivity can be selected for forming a single mode laser. Hence, selection of different HCG characteristics can result in differences in wavelengths capable of being emitted by the VCSEL and enhancing ability of the VCSEL to operate as a single mode laser. For instance, the particular characteristics of the HCG can produce greater loss for higher order modes (e.g., in the laser cavity) than for lower order modes (e.g., by the reflectivity being higher for the lower order modes).

The wavelength emitted can be a function of a bandgap of the semiconductor and the modes of the optical cavity. In general, the maximum gain will occur for photons with energy slightly above the bandgap energy, and the modes nearest the gain peak will lase most strongly. Some laser diodes, such as most visible lasers, operate at a single wavelength, but that wavelength may be unstable due to fluctuations in current or temperature.

Due to diffraction, a beam may diverge rapidly after leaving the laser (e.g., a semiconductor laser on a chip). In some situations, a number of lenses may be used to form a collimated beam. For VCSELs, using symmetrical lenses, the collimated beam is elliptical in shape, due to a difference in vertical and lateral divergences. Using an integrated HCG may at least partially replace collimating lenses, while also reducing emitted photons to a single lasing wavelength or a narrow band of lasing wavelengths.

In some situations, a layer of low bandgap material can be sandwiched between two high bandgap layers. One pair of such materials is gallium arsenide (GaAs) with aluminium gallium arsenide ($Al_xGa_{(1-x)}As$). The region where free electrons and holes exist simultaneously, the active region, can be confined to a thin middle layer, such that more of the electron-hole pairs can contribute to amplification and not as many are left out in a poorly amplifying periphery. In addition, photons can be reflected from a junction between the two materials such that the photons are confined to the active region where the amplification takes place.

If the middle layer is made thin enough, it may act as a quantum well in which a vertical variation of an electron's wavefunction, and thus a component of its energy, is quantized. The efficiency of a quantum well laser may be greater than that of a bulk laser because the density of states function of electrons in the quantum well may have an abrupt edge that concentrates electrons in energy states that contribute to laser action. Lasers containing more than one quantum well layer may be termed "multiple quantum well", lasers. Multiple quantum wells may improve an overlap of the gain region with the optical waveguide mode. Further improvements in laser efficiency may be achieved by reducing the quantum well layer to a quantum wire or to a "sea" of quantum dots.

A quantum well diode as just described may have a thin layer that is too small to effectively confine the light. To compensate, another two layers may be added on, for example, outside the first three. These layers may have a lower refractive index than the center layers and, as such, more effectively confine the photons.

VCSELs have an optical cavity axis along a direction of current flow rather than perpendicular to the current flow (e.g., as in other laser diodes). The active region length is short compared with the lateral dimensions so that the photons emerge from the top surface of the cavity rather than from its edge. Reflectors at the top and bottom of the cavity may be dielectric mirrors made from alternating layers of high and low refractive index materials that are a quarter-wavelength thick, which may be DBR mirrors. Such DBR mirrors may provide a high degree of wavelength-selective reflectance at a desired free surface wavelength if the thicknesses of the alternating layers and the refractive indices are such that they lead to constructive interference of partially reflected waves at the interfaces.

There are several advantages to producing VCSELs when compared with producing edge-emitting lasers. Edge-emitters are not tested until an end of the production process. If the edge-emitter does not work, whether due to bad contacts or poor material growth quality, production time may be increased and the processing materials may be sacrificed. Additionally, because VCSELs emit the beam perpendicular to the active region of the laser as opposed to parallel as with an edge emitter, many VCSELs (e.g., thousands) may be processed simultaneously on a single substrate (e.g., monolithically on a single semiconductor chip). Accordingly, the yield of VCSELs may be controlled to a more predictable outcome compared to edge-emitting lasers.

Figure 2:
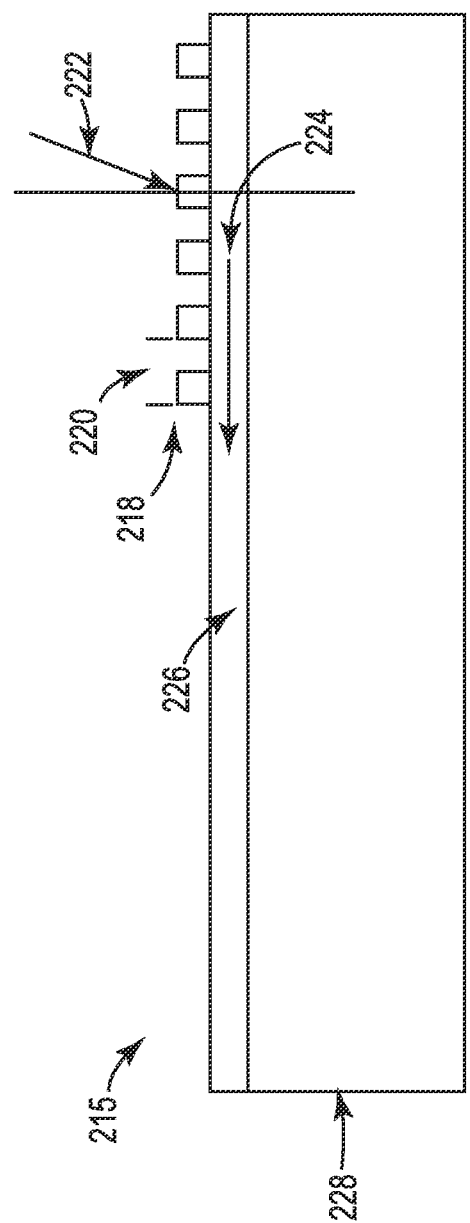
FIG. 2 illustrates an example of a grating coupler integrated with a single mode waveguide according to the present disclosure.

FIG. 2 illustrates an example of a grating coupler integrated with a single mode waveguide according to the present disclosure. The grating coupler integrated with a single mode waveguide 215 illustrated in FIG. 2 can include a grating coupler 218, where the grating has a predetermined pitch 220 for refraction of incident light 222, for example, of a particular wavelength and/or at a particular incident angle from normal (e.g., perpendicular to the grating). The pitch 220 (in addition to the duty cycle) of the grating coupler 218 can refract such that the incident light 222 travels in an intended direction along a single mode waveguide 226.

The single mode waveguide 226 can be supported by a substrate 228. In various examples, the substrate 228 can include a number of layers having refractive and/or reflective indices that differ from the single mode waveguide 226. As such, for example, the substrate 228 may have an oxide layer adjacent the single mode waveguide 226, the oxide layer formed on a silicon layer.

The pitch ($\Lambda$) of the grating for refracting light along the waveguide can be predetermined for a particular wavelength of incident light ($\lambda$) at a particular incident angle ($\phi$) to normal (e.g., $\phi$ can have a value of 0.0 when the incident light is provided normal to the grating) using the effective refractive index of the waveguide $n_{eff}$ (e.g., a propagation vector normalized versus air) by, for example, the following formula:

$$\Lambda = \lambda/(n_{eff} - \sin \phi)$$

Efficiency of the grating coupler may be improved, in various examples, by forming the grating coupler from high-index silicon, forming the grating coupler with a blazed grating, and/or placing a reflective material (e.g., a mirror) under the grating.

In laser optic communication, a single-mode waveguide can be an optical fiber designed to carry only a single spatial mode of light. Modes, in this context, are possible solutions of the Helmholtz equation for waves, which is obtained by combining Maxwell's equations and boundary conditions. These modes define the way the wave travels through space (e.g., how the wave is distributed in space). Lightwaves can have the same mode but may have different frequencies. This can be the case in single mode waveguides, which can carry lightwaves with different frequencies, but having the same spatial mode, which means that they are distributed in space in the same way.

Single mode waveguides can exhibit notably less modal dispersion than multi-mode waveguides. Single mode waveguides can, therefore, be better at retaining the fidelity of each light pulse over longer distances than multi-mode waveguides. For these reasons, single mode waveguides can have a higher bandwidth than multi-mode waveguides.

Figure 3:
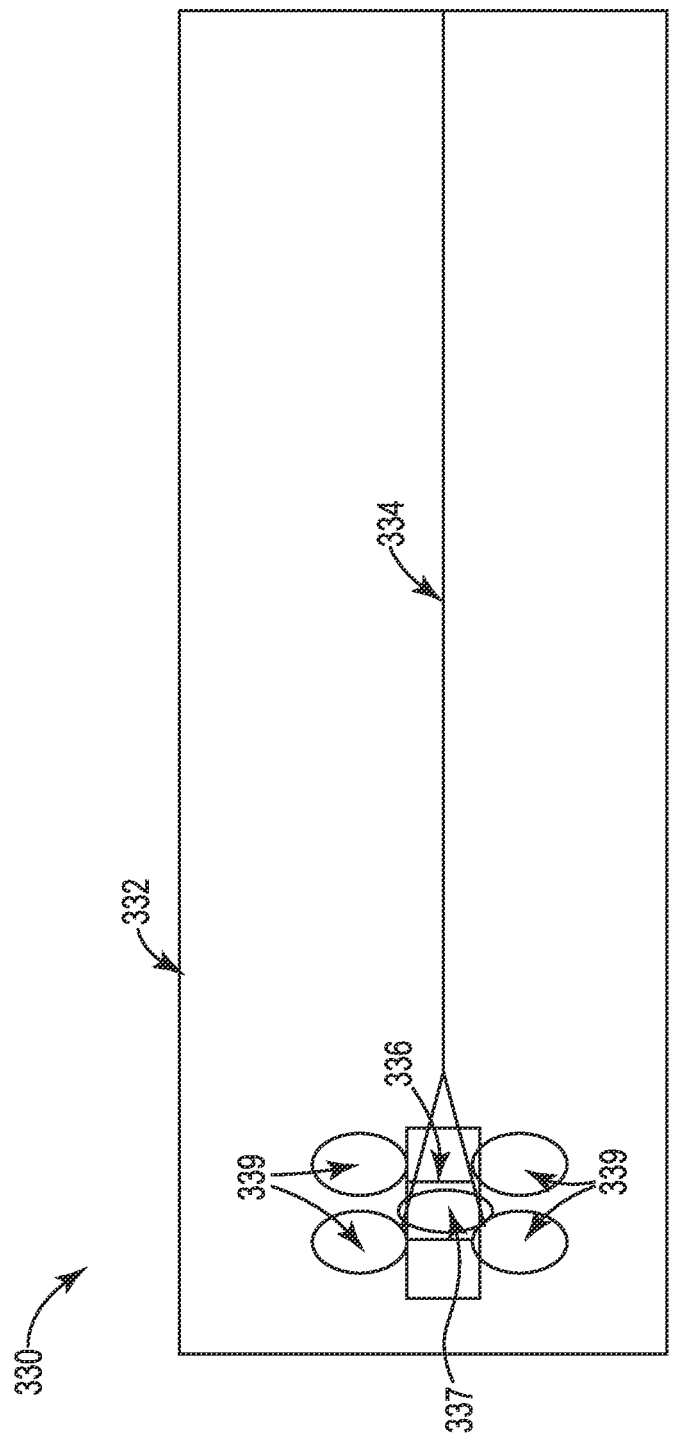
FIG. 3 is an example of a single mode waveguide integrated with a grating coupler connected to an integrated VCSEL with HCG according to the present disclosure.

FIG. 3 is an example of a single mode waveguide integrated with a grating coupler connected to an integrated VCSEL with HCG according to the present disclosure. The single mode waveguide integrated with the grating coupler connected to the integrated VCSEL with HCG 330 illustrated in FIG. 3 can include the same being formed on a substrate 332 (e.g., silica on silicon, among others).

The single mode waveguide 334 integrated with the grating coupler 336, as described herein, can be formed on the substrate 332. The single mode waveguide 334 can have a wider transition region to integrate with the grating coupler 336 to provide a funnel for photons into a narrower pathway compared to an area of an incident light beam 337 on the grating coupler 336.

The incident light beam 337 can be emitted by a single integrated VCSEL with HCG (not shown), as described herein, positioned adjacent the grating coupler 336 such that photons (e.g., of a particular lasing wavelength) emitted therefrom impact the grating coupler 336. The substrate 332 can include a pattern (e.g., in various patterns) of solder bumps 339 thereon. The single integrated VCSEL with HCG (e.g., operating in a single mode) can include a corresponding pattern of solder bumps thereon (e.g., surrounding the aperture of the vertical cavity). As such, the single integrated VCSEL with HCG can be self-aligned with the grating coupler 336 by matching solder bumps in the corresponding patterns. Following such self-alignment, a bond can be formed between the matched solder bumps (e.g., by heating the matched solder bumps).

Such self-alignment can, for example, be performed by flipping the single integrated VCSEL with HCG (e.g., on a single semiconductor chip) onto the substrate 332 with the pattern of solder bumps 339 thereon such that the corresponding pattern of solder bumps on the single integrated VCSEL with HCG matches that on the substrate 332 by a "flip-chip" process. Similarly, for example, a plurality of VCSELs (e.g., each operating in a single mode) in a monolithically integrated array (e.g., on a single semiconductor chip) can each be self-aligned by the flip-chip process as a group with a plurality of grating couplers of separate single mode waveguides positioned on the substrate. In some examples, the single integrated VCSEL with HCG and/or the plurality of VCSELs in a monolithically integrated array (e.g., on a single semiconductor chip) can be flip-chipped directly onto a platform material and bonded thereto.

An input angle of the incident light (e.g., a particular incident angle to normal ($\phi$) of incident light 222 to be refracted along the path of a particular single mode waveguide, as illustrated in FIG. 2) can be changed. In various examples, the input angle can be determined by varying the height of some or all of the solder bumps. In various examples, the input angle can be determined by etching a certain depth into the platform material under an intended position of some or all of the solder bumps.

Figure 4:
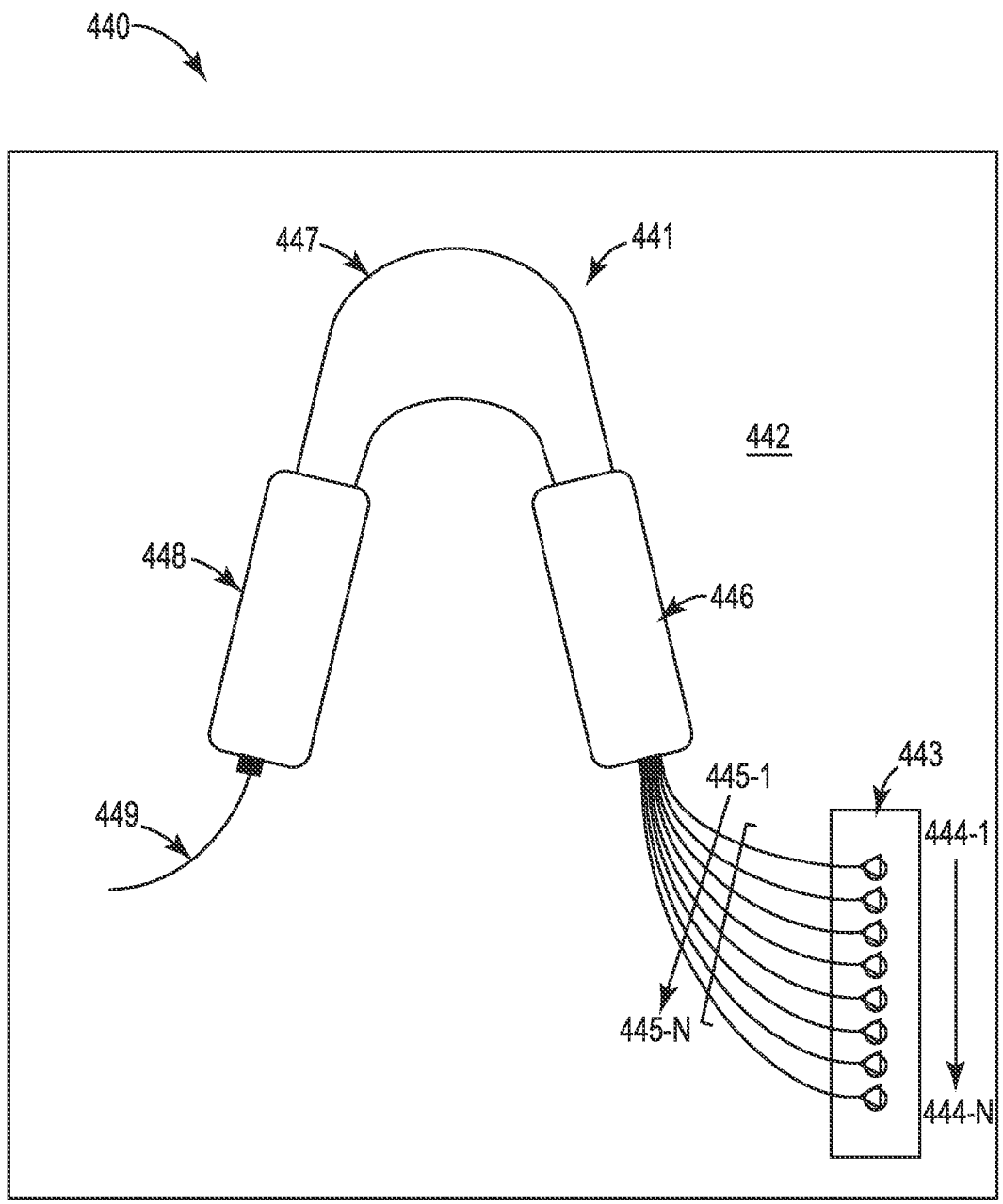
FIG. 4 illustrates an example of a wavelength division multiplexer integrated with a plurality of VCSELs according to the present disclosure.

FIG. 4 illustrates an example of a wavelength division multiplexer (WDM) integrated with a plurality of VCSELs according to the present disclosure. The WDM integrated with a plurality of VCSELs 440 (e.g., each operating in a single mode) illustrated in FIG. 4 can be, for example, formed on a platform 442 (e.g., that includes a glass or silica on silicon planar lightwave circuit (PLC), among other materials). The platform can, in some examples, be co-extensive and/or formed from the same or similar materials as the substrate 332 illustrated in FIG. 3.

The platform 442 can, for example, support a monolithically integrated array 443 (e.g., on a single semiconductor chip) that integrates a plurality of VCSELs with HCGs 444-1 through 444-N. Each of the plurality of VCSELs with HCGs 444-1 through 444-N can be formed to produce the same wavelengths of light (e.g., by being formed with the same cavity size and shape, the same active regions, the same DBR mirrors, etc.). However, the lasing wavelength emitted from each of the VCSELs with HCGs 444-1 through 444-N can be discrete from all others of the plurality by, as described herein, varying the pitch and/or duty cycle of the particular HCG (e.g., given a fixed thickness) integrated with the aperture of the vertical cavity of each of the plurality of VCSELs. As such, each of the plurality of VCSELs with HCGs 444-1 through 444-N can emit a discrete lasing wavelength (e.g., by each operating in a single mode). For example, the monolithically integrated array 443 shown in FIG. 4 can emit eight discrete lasing wavelengths from eight single mode VCSELs with HCGs formed thereon.

A plurality of single mode waveguides integrated with grating couplers 445-1 through 445-N, as described herein, can be connected to (e.g., self-aligned by the flip-chip process) each of each of the plurality of VCSELs with HCGs 444-1 through 444-N. For example, the monolithically integrated array 443 shown in FIG. 4 can emit eight discrete lasing wavelengths from eight single mode VCSELs with HCGs formed thereon that are collected and transmitted by eight single mode waveguides integrated with grating couplers. Each of the discrete lasing wavelengths, as described herein, can be considered a laser optics "channel".

Each of the plurality of single mode waveguides integrated with grating couplers 445-1 through 445-N can be gathered to feed the transmitted discrete lasing wavelengths into an input of the WDM 441. The WDM 441, as described herein, can be an arrayed wavelength grating (AWG) where the discrete lasing wavelengths are input into a first free space propagation region 446.

Incoming light can traverse the first free space propagation region 446 and enter a bundle of separate channel waveguides 447. The channel waveguides 447 have different lengths and thus apply a different phase shift at the exit of the channel waveguides 447 as the light traverses into second free space propagation region 448 where each of the discrete wavelengths can be combined for output in a single optical waveguide 449. When operated as just described, the AWG functions as a multiplexer.

When operated in a reverse direction, the AWG functions as a demultiplexer. For instance, when a plurality of wavelengths are input through a single optical waveguide, they interfere at entries of a plurality of single mode waveguides in such a way that each output channel receives only light of a certain wavelength.

The AWG can include a number of waveguides increased by a constant length increment. When functioning as a demultiplexer, light can be input into the device via a single optical waveguide. Light can diffract out of the input waveguide and propagate through the second free space propagation region and illuminates the waveguides with a Gaussian distribution. Each wavelength of light coupled to the waveguides can undergo a constant change of phase attributed to the constant length increment in the waveguides. Light diffracted from each waveguide can interfere constructively and become refocused at the separate channel waveguides, with the spatial position and the output channels being wavelength dependent on the phase shift.

AWGs can be used as optical (de)multiplexers in WDM systems. AWGs are capable of multiplexing a large number of wavelengths into a single optical waveguide, thereby increasing the transmission capacity of optical networks. AWGs are based on a fundamental principle of optics that light waves of different wavelengths interfere linearly with each other. This means that, if each channel in an optical communication network makes use of light of a slightly different wavelength, then the light from a large number of these channels can be carried by a single optical waveguide with negligible crosstalk between the channels. As such, the AWGs can be used to multiplex channels of several wavelengths onto a single optical waveguide at the transmission end and can also used as demultiplexers to retrieve individual channels of different wavelengths at the receiving end of an optical communication network.

Figure 5:
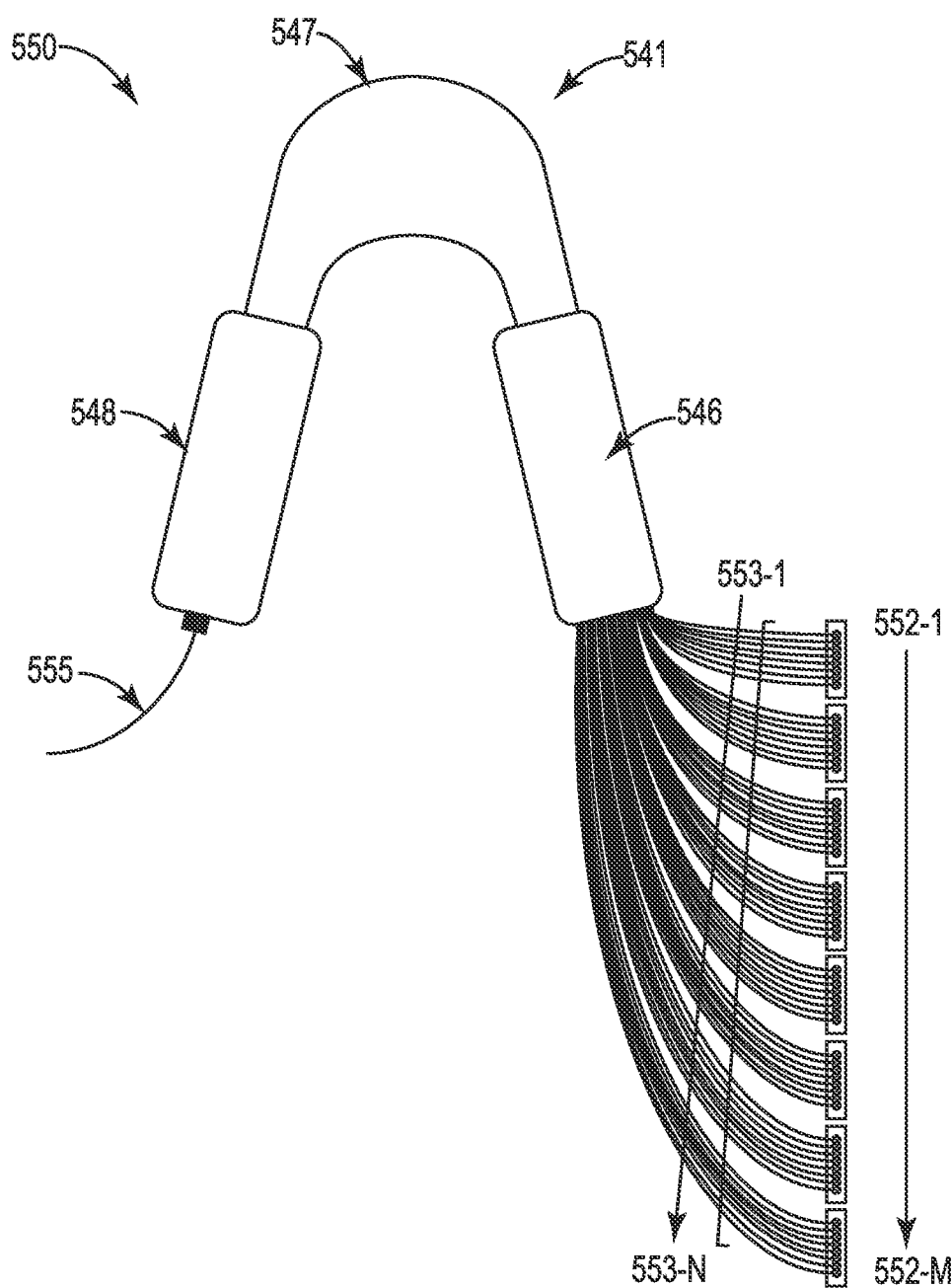
FIG. 5 illustrates an example of a wavelength division multiplexer integrated with a plurality of monolithically integrated arrays of VCSELs according to the present disclosure.

FIG. 5 illustrates an example of a WDM integrated with a plurality of monolithically integrated arrays of VCSELs according to the present disclosure. The WDM integrated with the plurality of monolithically integrated arrays of VCSELs 550 illustrated in FIG. 5 can include a WDM 541, for example, as described herein.

The WDM 541 can be integrated with a plurality of monolithically integrated arrays of VCSELs 552-1 through 552-N (e.g., each of the monolithically integrated arrays integrated on a single semiconductor chip). Each of the monolithically integrated arrays of VCSELs 552-1 through 552-M can include a plurality of VCSELs with HCGs formed thereon (e.g., as shown in FIG. 4). Each of the plurality of VCSELs with HCGs on a single monolithically integrated array can be formed to produce the same wavelengths of light (e.g., by being formed with the same cavity size and shape, the same active regions, the same DBR mirrors, etc.). However, each of the plurality of VCSELs with HCGs on a different array of the plurality of monolithically integrated arrays can be formed to produce different wavelengths of light (e.g., by being formed with different cavity size and shape, different active regions, different DBR mirrors, etc.).

The lasing wavelength emitted from each of the VCSELs with HCGs on each of the plurality of monolithically integrated arrays 552-1 through 552-M can be discrete from all others of the plurality. This can be performed by each of the plurality of monolithically integrated arrays 552-1 through 552-M being formed to produce a different wavelength or range of wavelengths in addition to, as described herein, varying the pitch and/or duty cycle of the particular HCG (e.g., given a fixed thickness) integrated with the aperture of the vertical cavity of each of the plurality of VCSELs. As such, each of the plurality of VCSELs with HCGs on each of the plurality of monolithically integrated arrays 552-1 through 552-M can emit a discrete lasing wavelength by each of the plurality of monolithically integrated arrays 552-1 through 552-M emitting a discrete range of wavelengths. For example, the eight monolithically integrated arrays shown in FIG. 5 can each emit eight discrete lasing wavelengths from eight single mode VCSELs with HCGs formed thereon.

A plurality of single mode waveguides integrated with grating couplers 553-1 through 553-M, as described herein, can be connected to (e.g., self-aligned by the flip-chip process) each of each of the plurality of VCSELs with HCGs on each of the plurality of monolithically integrated arrays 552-1 through 552-M. For example, each of the eight monolithically integrated arrays 552-1 through 552-M shown in FIG. 5 can emit eight discrete lasing wavelengths from eight single mode VCSELs with HCGs formed thereon that are collected and transmitted by 64 single mode waveguides integrated with grating couplers. Because each of the discrete lasing wavelengths, as described herein, can be considered a laser optics channel, FIG. 5 shows 64 channels being input into the WDM 541.

Each of the plurality of single mode waveguides integrated with grating couplers 553-1 through 553-M can be gathered to feed the transmitted discrete lasing wavelengths into an input of the WDM 541, where the discrete lasing wavelengths are input into a first free space propagation region 546. The incoming light can traverse the first free space propagation region 546 and enter the bundle of separate channel waveguides 547. The channel waveguides 547 have different lengths and thus apply a different phase shift at the exit of the channel waveguides 547 as the light traverses into a second free space propagation region 548 where each of the discrete wavelengths can be combined for output in a single optical waveguide 555. As illustrated in FIG. 5, the single optical waveguide 555 can carry a number of channels determined by a total number of discrete lasing wavelengths emitted from the plurality of VCSELs (e.g., each operating in a single mode) in each of the plurality of monolithically integrated arrays, which in this example is 64 channels.

As shown in FIG. 4, the WDM integrated with the plurality of monolithically integrated arrays of VCSELs 550 illustrated in FIG. 5 can be, for example, formed on a single platform (e.g., that includes a glass or silica on silicon PLC, among other materials). Electrical leads can, in various examples, be formed on the single platform for the plurality of the integrated VCSELs and the HCGs and the WDM (e.g., that includes the plurality of single mode waveguides). The electrical leads can, in various examples, enable modulation of drive currents that include data to be converted into light by the integrated VCSELs and the HCGs.

Figure 6:
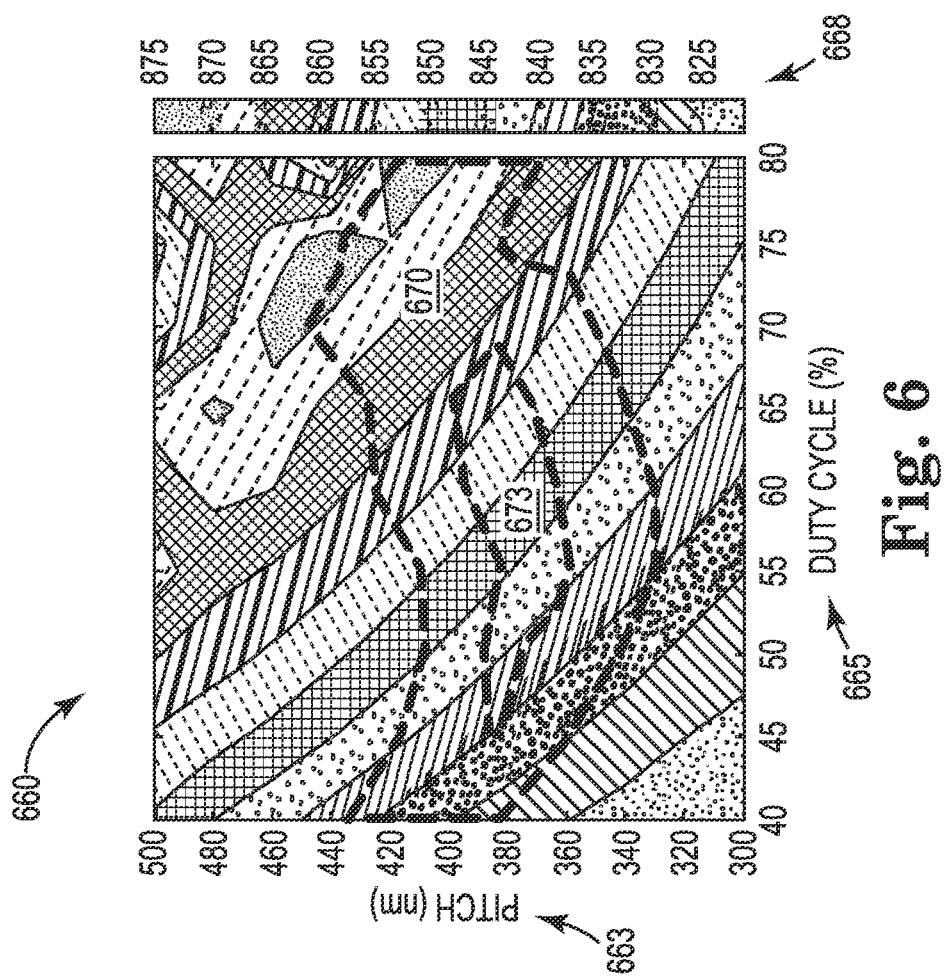
FIG. 6 is a graph illustrating an example of resonance wavelengths emitted by a VCSEL effected by a particular pitch and a particular duty cycle of an HCG according to the present disclosure.

FIG. 6 is a graph illustrating an example of resonance wavelengths emitted by a VCSEL effected by a particular pitch and a particular duty cycle of an HCG according to the present disclosure. The graph 660 illustrated in FIG. 6 includes a vertical axis showing a pitch 663 in nanometers (nm) for each of a number of HCGs integrated with apertures of vertical cavities of VCSELs. The graph includes a horizontal axis showing a duty cycle 665 expressed as a percentage (e.g., the duty cycle ratio multiplied by 100) for each of the number of HCGs integrated with apertures of vertical cavities of the same VCSELs.

Each of the VCSELs is formed to produce the same wavelength(s) of light (e.g., by being formed with the same cavity size and shape, the same active regions, the same DBR mirrors, etc.). However, predetermined variations in the pitch 663 and/or duty cycle 665 of the HCGs on each of a plurality of the VCSELs can result in a range of resonance wavelengths 668 being emitted. That is, each of the VCSELs can, depending on differences in the pitch and/or duty cycle of its integrated HCG, have a different resonance wavelength.

Resonance can be a tendency of a system (e.g., a VCSEL) to oscillate at a greater amplitude at some frequencies than at other frequencies. An optical cavity of a laser (e.g., a VCSEL) includes an arrangement of mirrors that form a standing wave resonator for light. Optical cavities of lasers are associated with the active region and provide reflective feedback of light produced by the active region. Light confined in the optical cavity reflects multiple times and produces standing waves for certain resonance frequencies. Different resonance frequencies can be produced by differences in the configuration of and/or distance between the mirrors associated with the optical cavity. As described in the present disclosure, an HCG integrated with the aperture of the vertical cavity of a VCSEL is one of the mirrors. As such, discrete resonance frequencies can be produced, and discrete lasing wavelengths can be emitted, from VCSELs formed to produce the same wavelength(s) of light by varying the pitch and/or duty cycle of the particular HCG (e.g., given a fixed thickness) integrated with the aperture of the vertical cavity.

As illustrated in the graph 660 of FIG. 6, VCSELs formed to produce the same wavelength(s) of light can have a range of resonance wavelengths 668 (e.g., which become emitted lasing wavelengths) where the particular wavelengths in the range depend upon the particular pitch and/or duty cycle of the HCG. The graph 660 shows that the range of resonance wavelengths 668 covers a range of at least 55 nm (e.g., from about 820 nm to about 875 nm, although the complete range of wavelengths is not shown) depending on the particular pitch 663 and/or the particular duty cycle 665 selected for the HCG. In this example, lengthening the pitch 663 of an HCG, while keeping the duty cycle 665 constant, tends to lengthen the resonance wavelength of the VCSEL. Similarly, increasing the duty cycle 665 of the HCG, while keeping the pitch 663 constant, also tends to lengthen the resonance wavelength of the VCSEL. For example, at a pitch of 400 nm, a duty cycle of 50% can result in a resonance wavelength of about 843 nm, whereas a duty cycle of 75% can result in a resonance wavelength of about 868 nm. Although the example just presented concerns a VCSEL that emits wavelengths between 800-900 nm, individual VCSELs and multi-wavelength VCSEL arrays, combined with HCGs, can be implemented across any desired range of wavelengths consistent with the present disclosure.

As describe in the present disclosure, a plurality of VCSELs, each formed to produce the same wavelength(s) of light, can be in a monolithically integrated array with an HCG integrated with an aperture of a vertical cavity of each in order to emit a single lasing wavelength (or a narrow band of wavelengths within 1 nm) of a plurality of discrete lasing wavelengths. Moreover, each of the plurality of VCSELs (e.g., each operating in a single mode) on different arrays of the plurality of monolithically integrated arrays can be formed to produce different wavelengths of light, where the HCGs on each of the plurality of monolithically integrated arrays can be tuned to produce resonance wavelengths, and therefore emit lasing wavelengths, with a range for each array that is discrete from all other ranges of the plurality of monolithically integrated arrays.

A quality factor (i.e., Q) is a dimensionless parameter that describes how under-damped an oscillator or a resonator is, which can reflect a resonator's bandwidth relative to its center frequency. A higher Q can indicate a lower rate of energy loss relative to a stored energy (e.g., a resonance frequency dampens more slowly). A range of frequencies at which a resonator resonates is the bandwidth and resonators with a higher Q operate over a smaller range of frequencies and are more stable. The Q can vary substantially between systems. Systems for which damping is important have a low Q (e.g., a door having a damper to prevent it from slamming shut can have a Q of about 0.5). In contrast, other systems in which strong resonance and/or high frequency stability are desired have a substantially higher Q (e.g., tuning forks can have a Q of around 1,000 and atomic clocks can have a Q of $10^{11}$ or more).

High Q values can be accomplished by selecting pitches and/or duty cycles in particular ranges. For example, the region marked as 670 in the graph 660 has a Q of at least 1,000. In the region marked as 670, selecting a pitch 663 of 380 nm can result in a range of resonant wavelengths of from about 828 nm to about 863 nm by varying the duty cycle 665 across the full range of from 40% to 80%. As such, a bandwidth of approximately 30-40 nm can be available, while retaining a Q of at least 1,000. The region marked as 673 has a Q of at least 10,000. In the region marked as 673, selecting a pitch 663 of 380 nm can result in a range of resonant wavelengths of from about 836 nm to about 855 nm by varying the duty cycle 665 across the range of from about 46% to about 68%. As such, a bandwidth of approximately 15-25 nm can be available, while retaining a Q of at least 10,000.

Discrete resonance wavelengths can be stably maintained through tuning of VCSELs with HCGs at separations of as little as 2-4 nm. As such, laser optics channels can be stably maintained at separations of as little as 2-4 nm. Hence, as shown in FIG. 5, a single optical waveguide 555 of a WDM 541 can, for example, carry 64 channels (e.g., from 64 discrete wavelengths emitted by 64 single mode VCSELs divided between 8 monolithically integrated arrays), which may cover a range of wavelengths as little as 128 nm. In some examples, the wavelengths may have wider separations. Accordingly, depending upon the spacing of the wavelengths in the channels and/or the number of channels carried by the single optical waveguide, the WDMs illustrated in FIGS. 4 and 5 can be coarse wavelength division multiplexers (CWDMs) or dense wavelength division multiplexers (DWDMs).

A temperature of a laser optics apparatus, as described herein, can, in various examples, affect wavelengths produced and/or emitted by the VCSELs and the HCGs and/or wavelengths carried in channels of the WDMs. For example, over a temperature variation of from 25 degrees Celsius to 85 degrees Celsius, such wavelengths can drift about 3.5 nm (e.g., about 0.06 nm per degree Celsius). Such a drift in wavelengths due to variance in temperature can particularly affect a DWDM that has a channel spacing of 2-5 nm. Further, such a variance in temperature can affect performance of a CWDM or DWDM by, for example, causing a drift in wavelengths (e.g., a drift to longer wavelengths) because the refractive indices thereof can change with the variance in temperature.

Hence, stabilizing the temperature of the laser optics apparatus can be useful in reducing a drift in wavelengths due to variance in temperature. For example, the platform on which the VCSELs with HCGs, the waveguides, and/or the WDM of the laser optics apparatus are positioned can, in various examples, be heated or cooled by a temperature stabilizing component such that an operating temperature of the laser optics apparatus has a reduced effect on the temperature and, therefore, on the drift of the wavelengths. That is, the temperature stabilizing component can stabilize a temperature of the plurality of the integrated VCSELs and the HCGs (e.g., while in operation). In some examples, the temperature stabilizing component also can stabilize a temperature of the plurality of single mode waveguides. The temperature stabilizing component can, for example, operate to counteract heat production by the other components to cool the other components to a relatively stable temperature. Alternatively or in addition, the temperature stabilizing component can, for example, operate to heat the other components to a relatively stable temperature such that the heat production by the other components does not notably increase the overall heat.

Figure 7:
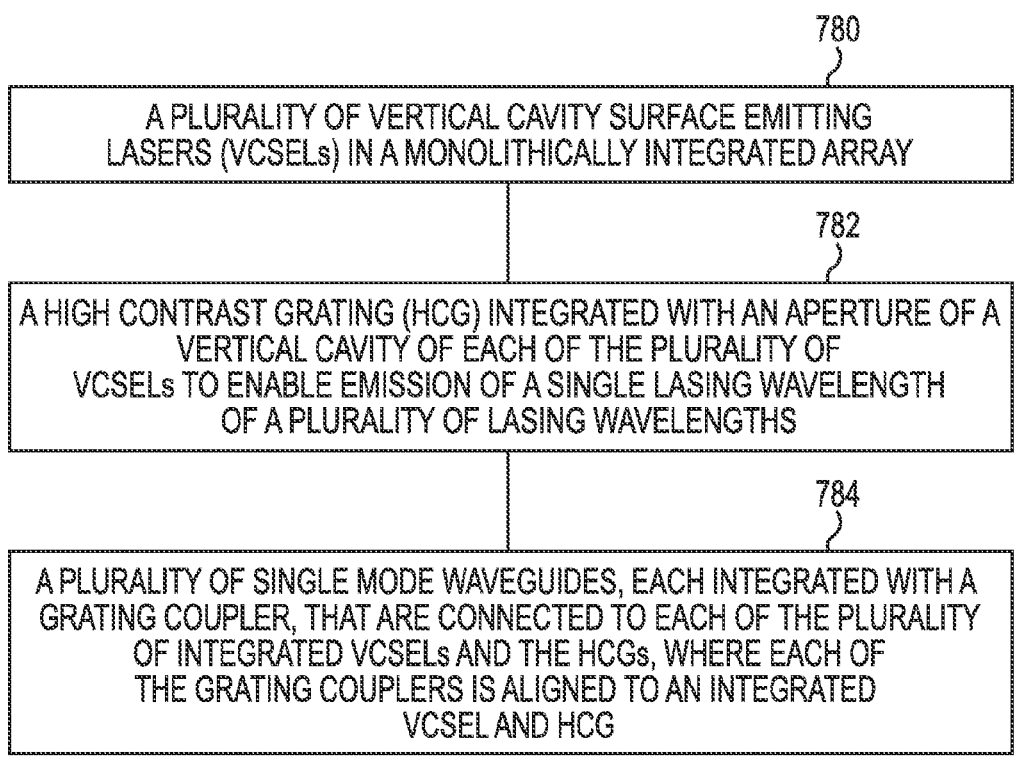
FIG. 7 illustrates an example of a laser optics apparatus formed according to the present disclosure.

FIG. 7 illustrates an example of a high density laser optics apparatus formed according to the present disclosure. In accordance with the descriptions of laser optics apparatuses disclosed herein, there is a plurality of VCSELs in a monolithically integrated array, as shown in block 780 of FIG. 7. In some examples, this plurality of VCSELs can be a plurality of first single mode VCSELs that is different from, as described herein, a plurality of second single mode VCSELs. As shown in block 782, there is an HCG integrated with an aperture of a vertical cavity of each of the plurality of the first VCSELs to enable emission of a single lasing wavelength of a plurality of lasing wavelengths (e.g., by each operating in a single mode). The example of the laser optics apparatus includes a plurality of single mode waveguides, each integrated with a grating coupler, that are connected to each of the plurality of the first integrated VCSELs and the HCGs, where each of the grating couplers is aligned to an integrated VCSEL and HCG, as shown in block 784.

In some examples of the present disclosure, the apparatus can include a plurality of second VCSELs, in a monolithically integrated array, where the plurality of the second VCSELs is configured to produce a wavelength discrete from a wavelength configured to be produced by the plurality of the first VCSELs. Being configured to produce different wavelengths can result from the first and second single mode VCSELs having, for instance, different sizes and/or shapes of optical cavities, different materials and/or configurations of active regions, and/or different types of mirrors, among other considerations.

As described herein, each of the plurality of the second VCSELs can, in various examples, include an HCG integrated with an aperture of a vertical cavity thereof such that a range of lasing wavelengths emitted by the plurality of the second VCSELs is discrete from a range of lasing wavelengths emitted by the plurality of the first VCSELs. Moreover, each HCG can enable each of the plurality of the first and/or second VCSELs to operate in a single mode to emit a discrete lasing wavelength.

As described herein, a plurality is intended to mean "two or more" without limitation of the actual number. That is, a plurality of VCSELs or a plurality of monolithically integrated arrays, among other examples, only means two or more of each particular item, the particular number of which can differ. For example, a plurality of first VCSELs and a plurality of second VCSELs can differ in the number of VCSELs in each plurality.

For example, FIG. 6 shows how variations in the pitch and/or duty cycle of the HCG integrated with the aperture of the vertical cavity of a VCSEL can result in a range of resonance wavelengths, which can enable each of the plurality of first VCSELs to emit a discrete lasing wavelength (e.g., by operating in a single mode). Similarly, variations in the pitch and/or duty cycle of the HCG integrated with the aperture of the vertical cavity of a second VCSEL (e.g., in a second monolithically integrated array) can result in a different range of resonance wavelengths, which can enable each of the plurality of second VCSELs to emit a discrete lasing wavelength (e.g., by each operating in a single mode). The discrete lasing wavelengths emitted by the plurality of second VCSELs can be in a range of wavelengths that is discrete from a range of wavelengths emitted by the plurality of first VCSELs. In some examples, the plurality of lasing wavelengths (e.g., emitted from each of the single mode VCSELs in each of the plurality of monolithically integrated arrays) can each be spaced apart in a range of from 1 nanometer to 20 nanometers.

In various examples, the plurality of single mode waveguides can be included in a WDM that integrates each of the discrete lasing wavelengths for output in a single optical waveguide, as shown in FIGS. 4 and 5, for example. The WDM can, for example, be a silica planar lightwave circuit on a silicon platform, as shown with regard to FIG. 4 but also applicable to FIG. 5.

Laser optics apparatuses can be fabricated by methods in accordance with the present disclosure. Unless explicitly stated, the method examples described herein are not constrained to a particular order or sequence. Additionally, some of the described method examples, or elements thereof, can occur or be performed at the same, or substantially the same, point in time.

In accordance with the present disclosure, laser optics apparatuses can, in various examples, be fabricated by processing a stack of semiconductor materials to form a plurality of VCSELs in a monolithically integrated array. Such processing can, for example, be performed by applying appropriate etching techniques to the stack of semiconductor materials, although the present disclosure is not limited to this type of implementation. The stack of semiconductor materials can, in various examples, include a first mirror material, a gain medium material, and a number of second mirror materials, among other materials, for producing a number of lasing wavelengths.

The first mirror material can be processed to form, as described herein, an HCG integrated with an aperture of a vertical cavity of each of the plurality of VCSELs to enable emission of a single lasing wavelength of a plurality of lasing wavelengths. Such processing can, for example, be performed by applying appropriate etching techniques to the first mirror material, although the present disclosure is not limited to this type of implementation. Fabricating laser optics apparatuses, as described herein, can include self-aligning a grating coupler, integrated with a single mode waveguide, to each of the plurality of VCSELs integrated with an HCG, where each of the grating couplers is flip-chip self-aligned to a particular integrated VCSEL and HCG.

The first mirror material, used to form a number of HCGs as described herein, can be formed from a variety of chemical materials including, for example, group III-V compounds, group II-VI compounds, Si, Ge, SiGe, and ZnO, AlGaAs, GaAs, AlAs, InAlGaAs, InP, InAs, InGaAs, InAlAs, InGaAsP, InGaAlAsP, InGaN, InGaAlN, GaN, InGaAlAsN, GaAlSb, GaSb, AlSb, among others, and/or combinations thereof. Just the abbreviations for the elements are used because different ratios of each element (e.g., stoichiometries) can be used in various examples of the present disclosure to affect the resonance wavelengths achieved using various HCG configurations.

In addition to different chemical compositions of the first mirror material used to form the HCGs, along with variations in the thickness, pitch, and/or duty cycle of the formed HCGs, the HCGs can be formed with variations in shape, diameter, and/or orientation. For example, the HCGs can be formed with oval, circular, rectangular, or square configurations, or mixtures thereof, with any number of solid bars across a span of the grating, thus having any suitable diameter. In addition, the solid bars of the HCGs can be formed to extend parallel to a long axis of the grating, perpendicular to the long axis of the grating, or diagonal to the long axis of the grating, or mixtures thereof.

The gain medium material or materials, used to form active regions for generation of light wavelengths as described herein, can be formed from a variety of chemical materials including, for example, GaAs, InGaAs, AlGaAs, InAlGaAs, InGaAsP, InGaAlP, InGaAlN, among others, and/or combinations thereof. Such gain medium materials can, in various examples, be utilized to form active regions (e.g., multiple quantum wells, quantum dots, quantum wires, etc.) that produce resonant wavelengths, in combination with HCGs as described herein, that can, for example, be centered around 500 nm, 850 nm, 980 nm, 1,000, 1,300 nm, and 1,550 nm, among other wavelengths.

For example, different compositions and/or configurations of active regions and HCGs can be formed such that individual monolithically integrated arrays can have lasing wavelengths centered at discrete values (e.g., 980 nm, 1,000 nm, 1,020 nm, etc.) where discrete ranges of lasing wavelengths are emitted from each individual monolithically integrated array. The remainder of the constituents of the VCSELs can be fabricated from any desired material combination capable of supporting lasing at the desired wavelengths.

For example, each specific quantum well design (e.g., using the just presented variety of chemical materials), in combination with a number of different HCG configurations, can produce an available gain bandwidth of about 30-40 nm (e.g., with a Q of at least 1,000 as shown in FIG. 6). Bandwidths of about 120 nm centered, for example, around 980-1,000 nm can be produced using "strained" InGaAs (e.g., for the multiple quantum wells, quantum dots, quantum wires, etc.). Such a strain can be achieved by, for example, varying the amount of indium in an InGaAs compound such that there is a mismatch with the gallium and arsenide components.

Fabricating laser optics apparatuses can, in various examples, include epitaxially growing the stack of semiconductor materials. Epitaxial growth is a technique that can be used to fabricate various electronic and optical devices. Such devices can have a complicated structure, which may be formed from a number of thin layers with various compositions. Quality, performance, and lifetime of such devices may be influenced by purity, structural accuracy, and/or homogeneity of the epitaxial layers. Epitaxial crystal growth resulting in epitaxial layer accuracy, surface flatness, and/or interface abruptness may depend on a number of factors including the epitaxial layer growth method, the interfacial energy between substrate and epitaxial film, as well as a number of growth parameters, such as thermodynamic driving force, substrate and layer misfit, substrate misorientation, growth temperature, etc.

Epitaxial growth can, as described herein, be used for fabrication of VCSELs with HCGs from semiconductor materials. In addition to the other structures, epitaxial growth and etching thereof can be used to fabricate semiconductor quantum structures to yield such structures with high density (e.g., multiple quantum wells, quantum dots, quantum wires, etc.) and with few flaws. Epitaxial growth, among other suitable techniques, can be used for forming a monolithically integrated array, as described herein, on a single semiconductor chip.

Etching the first mirror material to form the HCG can, for example, include utilizing electron-beam lithography to etch predetermined variations in pitch and duty cycle of each HCG such that the predetermined variations in pitch and duty cycle of each HCG contribute to emitting discrete lasing wavelengths from each of the plurality of VCSELs (e.g., by each operating in a single mode). Although the present disclosure allows variation of the VCSEL wavelength solely resulting from changing HCG dimensions, which has practical benefits, the teachings of the present disclosure are not limited to this type of implementation. In particular, changing the HCG dimensions for changing induced resonance wavelengths can be utilized in combination with other changes in the VCSEL structure as desired for supporting a wider range of wavelengths or differing applications.

In addition, changes to the HCG dimensions can also be utilized as a fine tuning mechanism if other VCSEL process variations cannot be as well controlled. The pitch and/or duty cycle of individual HCGs can be fine-tuned by, for example, laser trimming. Such laser trimming can reliably effect changes in HCG dimensions of, for example, about 0.5 nm or less.

Fabricating laser optics apparatuses can, in various examples, include processing (e.g., etching, among other implementations) a number of layers of the gain medium material to form an active region, where the active region can include multiple quantum wells. Fabricating laser optics apparatuses can, in various examples, further include processing (e.g., etching, among other implementations) the number of second mirror materials to form a number of DBR mirrors at a closed end of the vertical cavity of each of the plurality of integrated VCSELs that in combination with the multiple quantum wells (along with the HCG and other constituents) contribute to producing a predetermined wavelength in a cavity of the laser optics apparatus.

Fabricating the laser optics apparatuses can, in various examples, include flip-chip self-aligning by, as described herein, matching solder bumps in a corresponding pattern and forming a bond between the matched solder bumps. For example, the single mode waveguide integrated with the grating coupler illustrated in FIG. 3 can include the same being formed on a substrate 332 (e.g., silica on silicon, among others). An example of a pattern of solder bumps is shown in FIG. 3 at indicator numbers 339. Such a pattern can be self-aligned to a corresponding pattern of solder bumps to connect the single mode waveguide integrated with the grating coupler to an integrated VCSEL with HCG (e.g., by heating the matched solder bumps). However, patterns are not limited to this example and can be any pattern of solder, including bumps in any shape as seen from above (e.g., circular, oval, square, rectangular, continuous or segmented raised lines, etc.). Alternatively or in addition, connecting the single mode waveguide to an integrated VCSEL with HCG such that light emitted by the integrated VCSEL with HCG (e.g., operating in a single mode) is properly aligned with the grating coupler can be otherwise implemented (e.g., actively aligned during and/or after fabrication) and remain within the scope of the present disclosure.

In accordance with the present disclosure, high density laser optics apparatuses can be operated by integrating a single mode waveguide integrated with a grating coupler, of a WDM, to each of a plurality of VCSELs, each integrated with an HCG, in a plurality of monolithically integrated arrays, integrating a plurality of discrete emitted lasing wavelengths, via the WDM, into a single optical waveguide, and determining a number of optical channels carried by the single optical waveguide by determining a total number of discrete lasing wavelengths emitted from the plurality of VCSELs (e.g., each operating in a single mode) in each of the plurality of monolithically integrated arrays.

For example, as shown in FIG. 5, each of eight monolithically integrated arrays can emit eight discrete lasing wavelengths, from eight single mode VCSELs with HCGs formed thereon, that are collected and transmitted by 64 single mode waveguides integrated with grating couplers. Because each of the discrete lasing wavelengths, as described herein, can be considered a laser optics channel, FIG. 5 shows 64 channels being input into the WDM and being output in a single optical waveguide. When each laser optics channel transmits at 25 gigabits per second, for example, 64 channels can collectively transmit at 1.6 terabits per second.

Each of the plurality of VCSELs in a particular monolithically integrated array can, in various examples, be configured to produce a wavelength discrete from wavelengths configured to be produced by other monolithically integrated arrays and the HCGs can be configured to enable discrete ranges of discrete resonant wavelengths to be emitted by the plurality of VCSELs in each of the plurality of monolithically integrated arrays (e.g., by each operating in a single mode).

Examples of the present disclosure may include laser optics apparatuses, systems, and methods, including executable instructions and/or logic to facilitate fabricating and/or operating the laser optics apparatuses. Processing resources can include one or more processors able to access data stored in memory to execute the formations, actions, functions, etc., as described herein. As used herein, "logic" is an alternative or additional processing resource to execute the formations, actions, functions, etc., described herein, which includes hardware (e.g., various forms of transistor logic, application specific integrated circuits (ASICs), etc.), as opposed to computer executable instructions (e.g., software, firmware, etc.) stored in memory and executable by a processor.

It is to be understood that the descriptions presented herein have been made in an illustrative manner and not a restrictive manner. Although specific examples for apparatuses, systems, methods, computing devices, and instructions have been illustrated and described herein, other equivalent component arrangements, instructions, and/or device logic can be substituted for the specific examples presented herein without departing from the spirit and scope of the present disclosure.

What is claimed:

1. A high density laser optics apparatus, comprising:
  a plurality of first vertical cavity surface emitting lasers (VCSELs) in a monolithically integrated array;
  a high contrast grating (HCG) integrated with an aperture of a vertical cavity of each of the plurality of the first VCSELs to enable emission of a single lasing wavelength of a plurality of lasing wavelengths; and
  a plurality of single mode waveguides, each integrated with a grating coupler, that are connected to each of the plurality of the first integrated VCSELs and the HCGs, wherein each of the grating couplers is aligned to an integrated VCSEL and HCG.

2. The apparatus of claim 1, comprising a plurality of second VCSELs, in a monolithically integrated array, wherein the plurality of the second VCSELs is configured to produce a wavelength discrete from a wavelength configured to be produced by the plurality of the first VCSELs.

3. The apparatus of claim 2, wherein each of the plurality of the second VCSELs comprises an HCG integrated with an aperture of a vertical cavity thereof such that a range of lasing wavelengths emitted by the plurality of the second VCSELs is discrete from a range of lasing wavelengths emitted by the plurality of the first VCSELs.

4. The apparatus of claim 1, wherein each HCG enables each of the plurality of the first VCSELs to operate in a single mode to emit a discrete lasing wavelength.

5. The apparatus of claim 4, wherein the plurality of single mode waveguides comprises a wavelength division multiplexer (WDM) that integrates each of the discrete lasing wavelengths for output in a single optical waveguide.

6. The apparatus of claim 4, wherein the WDM is a silica planar lightwave circuit on a silicon platform.

7. A high density laser optics apparatus, comprising:
  a plurality of vertical cavity surface emitting lasers (VCSELs) in a monolithically integrated array;
  a high contrast grating (HCG) integrated with an aperture of a vertical cavity of each of the plurality of the VCSELs to enable emission of a single lasing wavelength of a plurality of lasing wavelengths, wherein the plurality of lasing wavelengths is each spaced apart in a range of from 1 nanometer to 20 nanometers; and a plurality of single mode waveguides, each integrated with a grating coupler, that are connected to each of the plurality of the integrated VCSELs and the HCGs, wherein each of the grating couplers is aligned to an integrated VCSEL and HCG.

8. The apparatus of claim 7, wherein each of the grating couplers is self-aligned to the integrated VCSEL and the HCG.

9. The apparatus of claim 7, further comprising electrical leads formed on a single platform for the plurality of the integrated VCSELs and the HCGs and the plurality of single mode waveguides, wherein the electrical leads enable modulation of drive currents that include data to be converted into light by the integrated VCSELs and the HCGs.

10. The apparatus of claim 7, further comprising a temperature stabilizing component that stabilizes a temperature of the plurality of the integrated VCSELs and the HCGs.

11. A method of fabricating a high density laser optics apparatus, comprising:
processing a stack of semiconductor materials to form a plurality of vertical cavity surface emitting lasers (VCSELs) in a monolithically integrated array, wherein the stack of semiconductor materials comprises:
a first mirror material;
a gain medium material; and
a number of second mirror materials;
processing the first mirror material to form a high contrast grating (HCG) integrated with an aperture of a vertical cavity of each of the plurality of VCSELs to enable emission of a single lasing wavelength of a plurality of lasing wavelengths; and self-aligning a grating coupler, integrated with a single mode waveguide, to each of the plurality of VCSELs integrated with an HCG, wherein each of the grating couplers is flip-chip self-aligned to a particular integrated VCSEL and HCG.

12. The method of claim 11, wherein flip-chip self-aligning each of the grating couplers to the particular integrated VCSEL and HCG includes matching solder bumps in a corresponding pattern and forming a bond between the matched solder bumps.

13. The method of claim 11, wherein processing the first mirror material to form the HCG includes utilizing electron-beam lithography to etch predetermined variations in pitch and duty cycle of each HCG such that predetermined variations in pitch and duty cycle of each HCG contribute to emitting discrete lasing wavelengths from each of the plurality of VCSELs.

14. The method of claim 11, further comprising processing a number of layers of the gain medium material to form an active region, wherein the active region comprises multiple quantum wells.

15. The method of claim 14, further comprising processing the number of second mirror materials to form a number of distributed Bragg reflector mirrors at a closed end of the vertical cavity of each of the plurality of integrated VCSELs that in combination with the multiple quantum wells contribute to producing a predetermined wavelength.

* * * * *